United States Patent
Lee et al.

(10) Patent No.: US 7,968,891 B2
(45) Date of Patent: Jun. 28, 2011

(54) ORGANIC LIGHT EMITTING DISPLAY AND FABRICATION METHOD OF THE SAME

(75) Inventors: Yul-Kyu Lee, Yongin-si (KR); Chun-Gi You, Hwaseong-si (KR); Sun Park, Hwaseong-si (KR); Jong-Hyun Park, Yongin-si (KR); Soo-Hyun Kim, Cheonan-si (KR); Hee-Sang Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 255 days.

(21) Appl. No.: 12/416,021

(22) Filed: Mar. 31, 2009

(65) Prior Publication Data

US 2010/0065849 A1    Mar. 18, 2010

(30) Foreign Application Priority Data

Sep. 17, 2008    (KR) .................. 10-2008-0091225

(51) Int. Cl.
*H01L 27/14* (2006.01)
(52) U.S. Cl. ............... 257/72; 257/57; 257/62; 257/79; 257/82; 257/98; 257/E21.532; 438/34; 438/99; 438/149; 438/151; 438/154
(58) Field of Classification Search .................. None
See application file for complete search history.

(56) References Cited

U.S. PATENT DOCUMENTS

2004/0206960 A1* 10/2004 Nishikawa .............. 257/72

FOREIGN PATENT DOCUMENTS

| JP | 08-195495 | 7/1996 |
|----|-----------|--------|
| JP | 2004-327539 | 11/2004 |
| JP | 2008-028363 | 2/2008 |
| KR | 10-2004-0012391 | 2/2004 |

\* cited by examiner

*Primary Examiner* — N Drew Richards
*Assistant Examiner* — Kyoung Lee
(74) *Attorney, Agent, or Firm* — Innovation Counsel LLP

(57) ABSTRACT

Disclosed is an organic light emitting display. In the organic light emitting display, a substrate is divided into a display region, in which an image is displayed, and a non-display region surrounding the display region. The organic light emitting display includes a plurality of pixels provided on the display region. At least one thin film transistor is formed on the non-display region. The display region includes a first electrode connected to the thin film transistor, an organic light emitting layer formed on the first electrode, and a second electrode formed on the organic light emitting layer to apply voltage to the organic light emitting layer with the first electrode. A light blocking layer having an opening formed below the semiconductor layer is formed on the non-display region.

26 Claims, 5 Drawing Sheets

ORGANIC LIGHT EMITTING DISPLAY AND FABRICATION METHOD OF THE SAME

CROSS-REFERENCE TO RELATED APPLICATION

This application relies for priority upon Korean Patent Application No. 2008-91225 filed on Sep. 17, 2008, the contents of which are herein incorporated by reference in their entirety.

BACKGROUND OF THE INVENTION

1. Field of the Invention

The present invention relates to an organic light emitting display and fabrication method of the same. More particularly, the present invention relates to a bottom emission-type organic light emitting display including a patterned light blocking layer and fabrication method of the same.

2. Description of the Related Art

Recently, the technical development of semiconductors and display apparatuses related to communication and computers has been highlighted. Among the display apparatuses, an organic light emitting display has attracted attention as a device to express natural colors.

The organic light emitting display includes an organic light emitting layer to emit light and electrodes to apply voltage to the organic light emitting layer. The electrodes include a thin film transistor to control the light emitting layer. However, the light may be reflected or scattered due to metal lines of the thin film transistor so that visibility failure may occur. Thus, the visibility failure may cause a contrast ratio to be lowered. Accordingly, a method of forming a light blocking layer below the thin film transistor using metal having a low reflectivity has been taken into consideration. However, even if the light blocking layer including the metal having a low reflectivity prevents light from being reflected or scattered, the light blocking layer easily absorbs heat due to the metal, so that the light blocking layer may cause defects because of heat in the subsequent processes. In addition, the light blocking layer is easily melted under a predetermined temperature, thereby causing failure.

SUMMARY OF THE INVENTION

Therefore, the present invention provides an organic light emitting display capable of reducing failure, which has a light blocking layer having an opening formed at a predetermined region of the light blocking layer.

The organic light emitting display includes a substrate, at least one thin film transistor, an organic light emitting layer, first and second electrodes, and a light blocking layer. The substrate includes a plurality of pixels including a display region, in which an image is displayed, and a non-display region surrounding the display region. The thin film transistor is formed on the non-display region of the substrate. The thin film transistor includes a semiconductor layer. The first electrode is formed on the display region. The organic light emitting layer is formed on the first electrode. The second electrode is formed on the organic light emitting layer, and applies voltage to the organic light emitting layer with the first electrode. The light blocking layer is formed on the non-display region of the substrate. The light blocking layer has an opening which is overlapped with the semiconductor layer.

The at least one thin film transistor includes a first thin film transistor to apply voltage to the first electrode, and a second thin film transistor to switch the first thin film transistor. The thin film transistors are formed on the substrate. Each of the thin film transistor includes a semiconductor layer including source, channel, and drain regions, a gate insulating layer formed on the semiconductor layer, a gate electrode formed on the gate insulating layer, an inter-layer dielectric layer having contact holes to expose a portion of the source and drain regions respectively, and source and drain electrodes connected to the source and drain regions through the contact holes, respectively. The semiconductor layer includes a polycrystalline silicon layer.

An opening of the light blocking layer formed below the semiconductor layer may have a size and a shape identical to those of the semiconductor layer, and may have a size smaller than that of the semiconductor layer if necessary.

A plurality of gate lines and a plurality of data lines are formed in the non-display region of the substrate. The gate lines and data lines cross each other to define the pixels.

An opening is further formed below the light blocking layer of the gate line and/or the data line. The opening formed below the gate line and/or the data line may have a width narrower than a width of the gate line and/or the data line in order to prevent light from leaking. The opening has a width narrower than that of the gate line and/or the data line, so that the light blocking layer may be overlapped with a portion of the gate line and/or the data line.

The light blocking layer includes a single layer of a chromium oxide (CrOx) layer, a double layer of a chromium oxide (CrOx) layer and a chromium nitride (CrNx) layer formed on the chromium oxide (CrOx) layer, or a triple layer of a chromium oxide (CrOx) layer, a chromium (Cr) layer formed on the chromium oxide (CrOx) layer, and the chromium oxide (CrOx) layer or a chromium nitride (CrNx) layer formed on the chromium (Cr) layer.

In one example, the organic light emitting display is a bottom emission type in which light is output from the second electrode to the first electrode. The first and second electrodes may serve as an anode and a cathode, or the cathode and the anode. For the case of the organic light emitting display being a bottom emission type, the first electrode includes a transparent material, and the second electrode includes metal including a transparent material or an opaque material.

The present invention provides a fabrication method of the organic light emitting display. In order to fabricate the organic light emitting display, a light blocking layer having an opening on a non-display region of a substrate, which includes a plurality of pixels including a display region and the non-display region, is formed. And then at least one thin film transistor including a semiconductor layer overlapped with the opening in the non-display region of the substrate having the light blocking layer is formed. Thereafter, a first electrode connected to the thin film transistor is formed on the display region, an organic light emitting layer is formed on the first electrode, and a second electrode is formed on the organic light emitting layer.

The semiconductor layer includes a polycrystalline silicon layer. The polycrystalline silicon layer may be formed through one of a solid phase crystallization scheme or process, an excimer laser annealing scheme or process, a metal induced crystallization scheme or process, and a sequential lateral solidification scheme or process.

The light blocking layer includes a single layer of chromium oxide (CrOx), a double layer of chromium oxide (CrOx)/chromium nitride (CrNx), or a triple layer of chromium oxide (CrOx)/chromium (Cr)/chromium nitride (CrNx).

As described above, in the organic light emitting display according to an embodiment of the present invention, the light blocking layer is not formed below the semiconductor layer of the thin film transistor, so that amorphous silicon can be easily crystallized.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
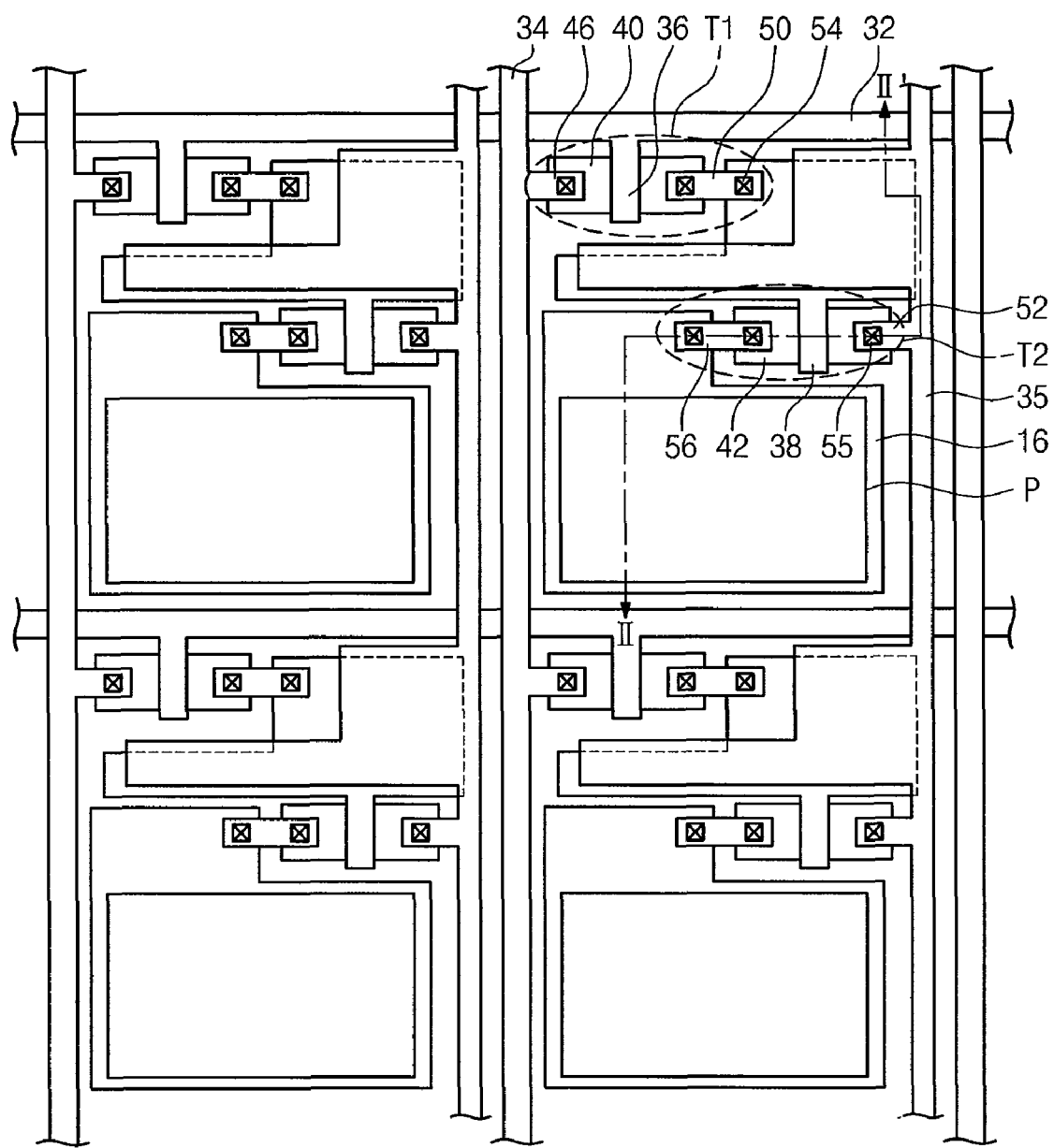
FIG. 1 is a plan view showing an organic light emitting display according to an embodiment of the present invention.

Hereinafter, a display apparatus according to an embodiment of the present invention will be described with reference to accompanying drawings. The above and other advantages, and a scheme for the advantages of the present invention will become readily apparent by reference to the following detailed description when considered in conjunction with the accompanying drawings. However, the scope of the present invention is not limited to such embodiments and the present invention may be realized in various forms. The embodiments to be described below are nothing but the ones provided to bring the disclosure of the present invention to perfection and assist those skilled in the art to completely understand the present invention. The present invention is defined only by the scope of the appended claims. In addition, the same reference numerals are used to designate the same elements throughout the drawings.

In addition, the size of layers and regions shown in the drawings can be simplified or magnified for the purpose of clear explanation. In the following description, when an element (or layer) is referred to as being "on" another element (or layer), the element (or the layer) can be directly on another element (or layer) or intervening layers may also be present therebetween. When an element (or layer) is referred to as being "directly on" another element (or layer), the element (or the layer) is directly on another element (or layer) without any intervening layers being present therebetween.

The organic light emitting display is a display apparatus to display an image by interposing a light emitting material between two electrodes. One electrode includes a conductive material having a high work function, and the other electrode includes a conductive material having a low work function. Both electrodes apply voltage to the light emitting layer, such that the light emitting material can emit light. In the organic light emitting display, the electrode of the conductive material having a high work function serves as an anode to inject holes to the light emitting material, and the electrode of the conductive material having a low work function serves as a cathode to inject electrons to the light emitting material.

In order for the light to be discharged to the outside of the organic light emitting display, one of the electrodes of the organic light emitting display includes a transparent material that rarely absorbs light in an emission wavelength region. In this case, the transparent material mainly includes ITO (Indium Tin Oxide). In general, the electrode including the transparent material corresponds to the anode to inject holes. The other electrode corresponds to the cathode, and the cathode includes metal having a low work function to easily inject electrodes.

When the anode having a high work function and the cathode having a low work function inject holes and electrodes to an organic light emitting layer, respectively, excitons are created in the organic light emitting layer. As the excitons are radiated or decayed, light corresponding to energy difference between LUMO (Lowest Unoccupied Molecular Orbital) and HOMO (Highest Occupied Molecular Orbital) of the organic light emitting layer is emitted.

FIG. 1 is a plan view showing the organic light emitting display according to an embodiment of the present invention. A light blocking layer is not shown in FIG. 1.

Figure 2:
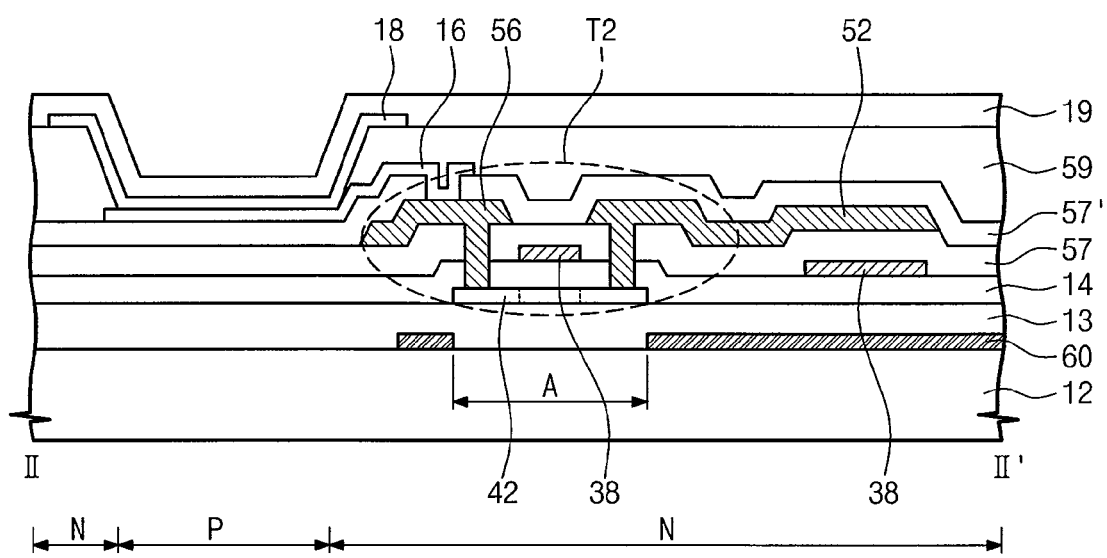
FIG. 2 is a cross sectional view taken along line II-II' of FIG. 1, showing an organic light emitting display according to an embodiment of the present invention.

FIG. 2 is a sectional view taken along line II-II' of FIG. 1, which shows the organic light emitting display according to an embodiment of the present invention.

Although the organic light emitting display includes a plurality of gate lines 32 and a plurality of data lines 34 crossing each other to define a plurality of pixels, only several pixels are shown for the convenience of explanation.

As shown in FIGS. 1 and 2, the organic light emitting display according to one embodiment of the present invention includes a plurality of pixels, and each pixel includes a display region P and a non-display region N. The display region P is provided therein with an organic light emitting layer 18 to output light, and a plurality of cells having the display region P may form an image.

The display region P includes the organic light emitting layer 18, a first electrode (anode) 16 to supply holes to the organic light emitting layer 18, and a second electrode (cathode) 19 to supply electrons to the organic light emitting layer 18. The type of the first and second electrodes 16 and 19 may be determined according to the magnitude of a work function of materials constituting the first and second electrodes 16 and 19. In other words, if a work function of the second electrode 19 is greater than a work function of the first electrode 16, the second electrode 19 serves as an anode, and the first electrode 16 serves as a cathode.

The non-display region N is provided therein with first and second thin film transistors T1 and T2 to apply voltage to the first electrode 16 such that the organic light emitting layer 18 is controlled. One thin film transistor may be employed. In the present embodiment, the second thin film transistor T2 driving the first electrode 16, and the first thin film transistor T1 applying data voltage to the second thin film transistor T2 is provided. Although the present embodiment has been described in that two thin film transistors T1 and T2 are formed, the present invention is not limited thereto. The first thin film transistor T1 or the second thin film transistor T2 may include the combination of at least one thin film transistor according to the operational characteristics thereof.

A substrate 12 includes a transparent insulating material. The gate lines 32 and the data lines 34 are formed on the substrate 12, which cross each other to define the pixels. The gate lines 32 extend in one direction. The data lines 34 extend in another direction (e.g., substantially perpendicular) and cross the gate lines 32. A gate insulating layer 57 is interposed between the gate and data lines 32 and 34. A power line 35 is arranged in parallel to the data line 34 in the vicinity of the data line 34. The power line 35 crosses the gate line 32.

The first and second thin film transistors T1 and T2 include gate electrodes 36 and 38, semiconductor layers 40 and 42, source electrodes 46 and 52, and drain electrodes 50 and 56.

The semiconductor layers 40 and 42 of the first and second thin film transistors T1 and T2 include a source region, a channel region, and a drain region, respectively. The source electrode 46 and the drain electrode 50 of the first thin film transistor T1 are connected to the source region and the drain region of the semiconductor layer 40 through contact holes, respectively. The source electrode 52 and the drain electrode 56 of the second thin film transistor T2 are connected to the source region and the drain region of the semiconductor layer 42 through contact holes, respectively.

The drain electrode 50 of the first thin film transistor T1 is connected to the gate electrode 38 of the second thin film transistor T2 through a contact hole 54, and the source electrode 52 of the second thin film transistor T2 is connected to the power line 35 through a contact hole 55. The drain electrode 56 of the second thin film transistor T2 is connected to the first electrode 16 formed in the display region P.

The second thin film transistor T2 includes the gate electrode 38, the semiconductor layer 42, the source electrode 52, and the drain electrode 56. The first electrode 16 is formed on the second thin film transistor T2. The second thin film transistor T2 is connected to the drain electrode 56. A protective layer 57' is interposed between the first electrode 16 and the drain electrode 56. As described above, the light emitting layer 18 to emit light is provided on the first electrode 16, and the second electrode 19 is provided on the organic light emitting layer 18.

The gate electrode 38 of the second thin film transistor T2 connected to the drain electrode 50 of the first thin film transistor T1 is overlapped with the source electrode 52 of the second thin film transistor T2 to form a capacitor.

Reference numerals 13, 14, 57, 57', and 59 represent a first insulating layer, a second insulating layer, a gate insulating layer, a protective layer, and a separator which are layers including an insulating material. The first insulating layer 13 insulates between a light blocking layer 60 and the semiconductor layer 42, and the second insulating layer 14 insulates between the semiconductor layer 42 and the gate electrode 38. The gate insulating layer 57 insulates between the gate electrode 38 and the source and drain electrodes 52 and 56, and the protective layer 57' insulates between the source and drain electrodes 52 and 56 and the first electrode 16. The separator 59 insulates between the display region P and the non-display region N.

The organic light emitting display having the above structure is classified into a bottom emission-type organic light emitting display and a top emission-type organic light emitting display according to transparency of the first and second electrodes 16 and 19 and a direction of light output from the organic light emitting layer 18. The present invention provides the bottom emission-type organic light emitting display to employ a lower substrate including a transparent material such that light is output from the second electrode 19 to the first electrode 16. In this case, the first electrode 16 preferably includes a transparent material such that light emitted from the organic light emitting layer 18 is transmitted therethrough. The second electrode 19 may include a transparent conductive material or an opaque conductive material.

Therefore, according to one embodiment of the present invention, the second electrode 19 may include an opaque conductive material such as metal, and the first electrode 16 may include a transparent conductive material such as ITO (Indium Tin Oxide), IZO (Indium Zinc Oxide), or metal oxide (e.g., a transparent metal thin film).

When the second electrode 19 includes a material (e.g., metal) having a low work function, and the first electrode 16 includes a material (e.g., metal oxide) having a high work function, the first electrode 16 serves as an anode to supply holes, and the second electrode 19 serves as a cathode to supply electrons. In contrast, when the first electrode 16 includes a material having a low work function, and the second electrode 19 includes a material having a high work function, the first electrode 16 serves as the cathode to supply electrons, and the second electrode 19 serves as the anode to supply holes.

However, when light is output in a lower direction, the light is reflected or scattered due to metal lines of the thin film transistors provided in the non-display region N, such as gate lines and data lines, so that a contrast ratio may be reduced, and visibility may be degraded. Accordingly, in order to prevent the light from being reflected or scattered, the light blocking layer 60 is formed by using metal oxide and metal having a low reflectivity.

In an embodiment of the present invention, the light blocking layer 60 is provided in the non-display region N, and includes a plurality of openings.

Figure 3:
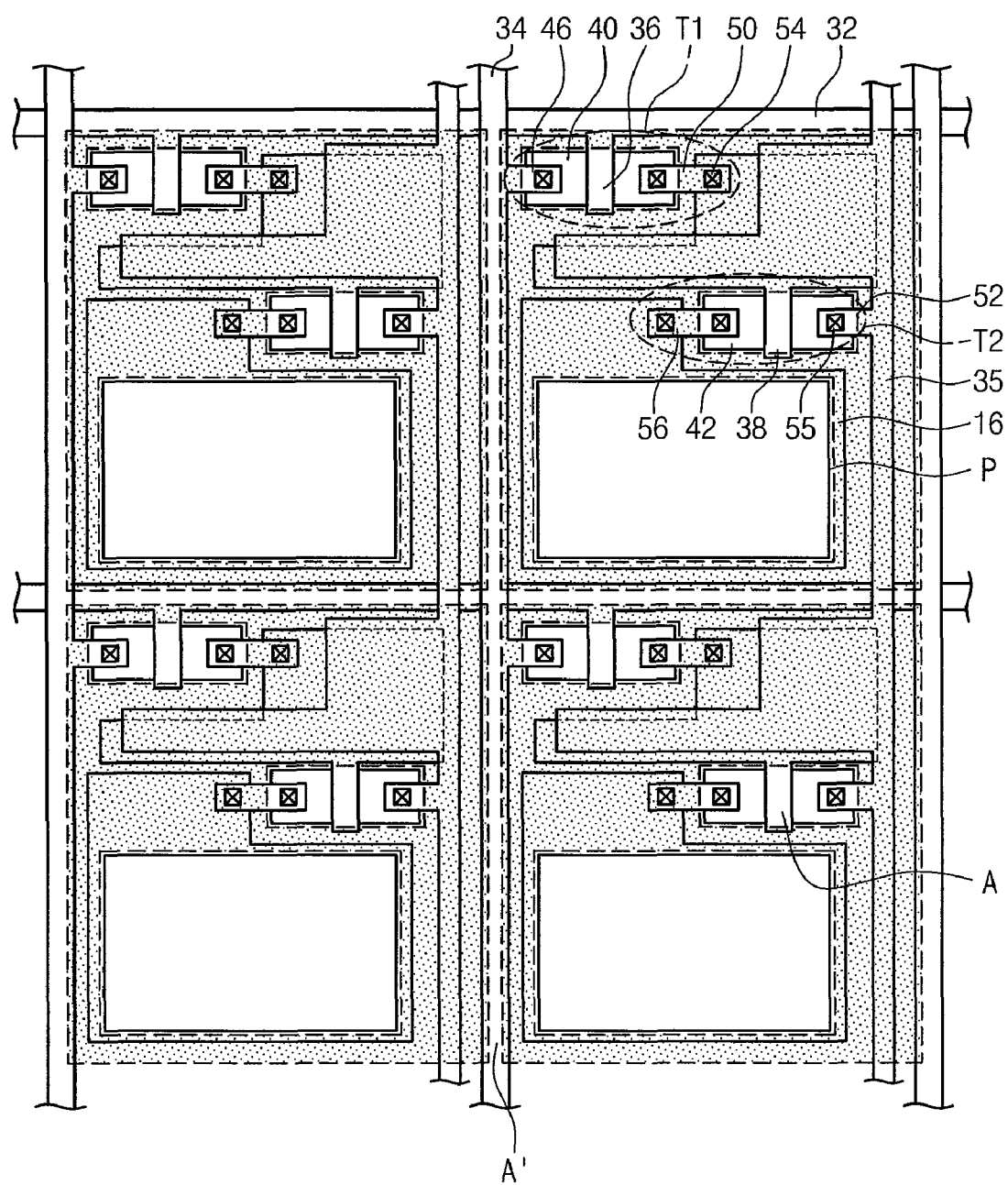
FIG. 3 is a plan view showing a region of a light blocking layer in the organic light emitting display of FIG. 1 according to one embodiment of the present invention.

FIG. 3 is a plan view showing a region of the light blocking layer 60 in the organic light emitting display of FIG. 1 according to one embodiment of the present invention. Although the light blocking layer 60 is illustrated as being positioned on a top portion in the drawings, it should be noted that the light blocking layer 60 is provided below the first and second thin film transistors T1 and T2.

As shown in FIG. 3, an opening A, which is obtained by removing a portion of the light blocking layer 60, is positioned corresponding to the region of the semiconductor layer 42. In other words, the opening A is formed on the non-display region N corresponding to the region of the semiconductor layers 40 and 42 of the first and second thin film transistors T1 and T2. In this case, the opening A has the same shape and size as those of the semiconductor layers 40 and 42.

If necessary, the opening A may have a size slightly greater or smaller than the size of the semiconductor layers 40 and 42. However, since the opening A must have a size sufficient to prevent light from leaking, the opening A preferably has the same size as those of the semiconductor layers 40 and 42 based on a design margin (in order to clearly show the region of the opening A in drawings, the opening A has a size slightly greater than a real size).

Reasons for the formation of the opening A, below which the light blocking layer 60 is not formed, based on the shape and size of the semiconductor layers 40 and 42 of the first and second thin film transistors T1 and T2 are as follows.

An active matrix scheme, which is a driving scheme mainly employed for the organic light emitting display, is to control the organic light emitting layer 18 by using a thin film transistor as a switching element. Although a semiconductor layer for the thin film transistor may include amorphous silicon or polycrystalline silicon, the polycrystalline silicon is advantageous in terms of a high-speed operation because the polycrystalline silicon has high field-effect mobility. However, when manufacturing a polycrystalline silicon transistor, since a high-temperature process based on a high-price quartz substrate is required, the polycrystalline silicon transistor is limited for application to a liquid crystal display in comparison with an amorphous silicon thin film transistor which only requires a low-temperature process. Accordingly, a method of depositing and then crystallizing amorphous silicon has been developed, and the method of depositing and then crystallizing the amorphous silicon includes an SPC (Solid Phase Crystallization) scheme (process), an ELA (Excimer Laser Annealing) scheme (process), a MIC (Metal Induced Crystallization) scheme (process), and an SLS (Sequential Lateral Solidification) scheme (process).

In particular, the SLS scheme is to repeatedly irradiate a laser beam onto an amorphous silicon layer (e.g., at least twice) to grow the side surface of grains. According to the SLS scheme, a laser beam having a predetermined beam width is primarily irradiated on the amorphous silicon layer so as to completely melt irradiated amorphous silicon. After completing the irradiation of the laser beam, the melted amorphous silicon is cooled, while a boundary surface between amorphous silicon and the melted amorphous silicon starts to crystallize, and the crystallized amorphous silicon portion becomes seeds. Due to latent heat of fusion generated when the seeds are created, the temperature is gradually reduced from the boundary surface between amorphous silicon and the melted amorphous silicon to the melted amorphous silicon. Since heat flux flows to a central portion of the melted amorphous silicon, lateral growth of a polycrystalline silicon layer may occur until the melted amorphous silicon is completely solidified. Subsequently, when the laser beam is secondarily irradiated on a region including the boundary surface between polycrystalline silicon having grains and amorphous silicon, the amorphous silicon and the polycrystalline silicon are melted. Thereafter, while the melted region is being cooled, silicon atoms become attached to the previously-formed polycrystalline silicon layer that has not been melted through the secondary laser beam irradiation to increase the crystal length of the polycrystalline silicon layer. Thus, a laser beam is irradiated twice or three times if necessary, thereby forming the polycrystalline silicon layer.

As described above, in the case of the SLS scheme employing a laser beam, high-temperature distribution appears around the region irradiated by the laser beam. In addition, heat is required in all of the SPC, ELA, and MIC schemes as well as the SLS scheme, or is inevitably emitted during the manufacturing process. However, since the light blocking layer 60 includes metal such as chromium (Cr) or molybdenum (Mo) having high thermal conductivity, if the light blocking layer 60 is formed below an amorphous silicon layer that must be crystallized, heat used to crystallize the amorphous silicon layer may be easily absorbed by the light blocking layer 60, resulting in heat leakage. Accordingly, such heat leakage prevents the amorphous silicon layer above the light blocking layer 60 from sufficiently being grown as grains, so that crystallization failure may be caused.

The crystallization failure can be overcome by forming the insulating layer 13 between the light blocking layer 60 and the semiconductor layer 42 and increasing the height of the insulating layer 13. However, in this case, even if crystallinity is improved, time and cost to form the insulating layer 13 having a thick thickness are additionally required, and contamination sources derived from the thick insulating layer 13 are increased so that electron mobility of a thin film transistor may be reduced.

Therefore, according to an embodiment of the present invention, the opening A obtained by removing a portion of the light blocking layer 60 corresponding to the region of the semiconductor layer 42 is formed to overcome the crystallization failure. Accordingly, even if a process of crystallizing amorphous silicon is performed in the region for the semiconductor layer 42, heat loss does not occur, and crystallization is uniformly performed in the region for the semiconductor layer 42 so that defect-free polycrystalline silicon can be obtained.

In an embodiment of the present invention, the opening A may be formed below the gate line 32 or the data line 34.

Figure 4:
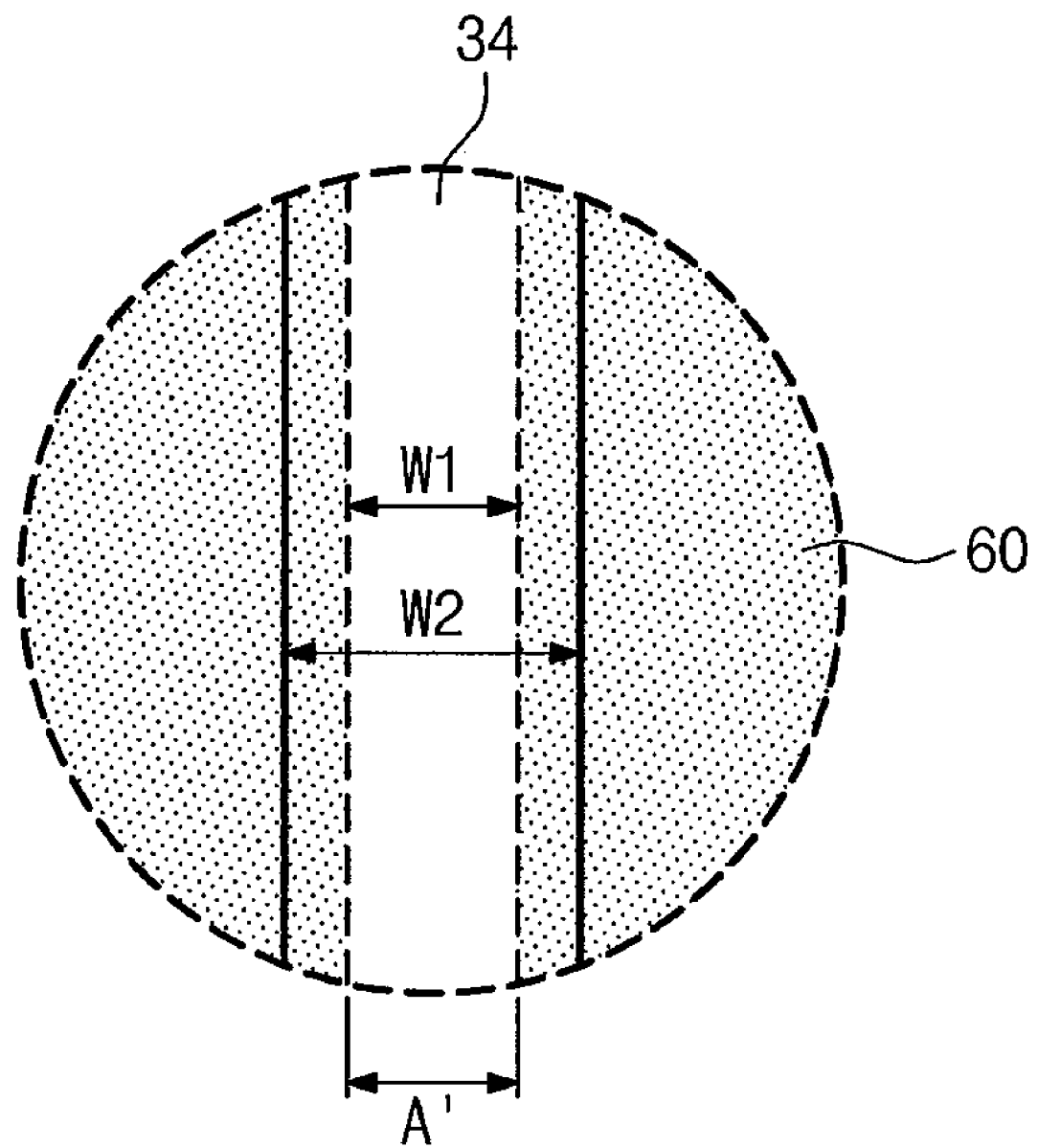
FIG. 4 is an enlarged plan view showing a portion of the data line in FIG. 3.

FIG. 4 is an enlarged view showing a portion of the data line 34 of FIG. 3, and, particularly, shows that the light blocking layer 60 is formed below the data line 34. An opening A' provided below the gate line 32 or the data line 34 divides the light blocking layer 60 into a plurality of parts.

Since the light blocking layer 60 is widely formed over the entire surface of the substrate 12 except for both the non-display region N and the lower portion of the semiconductor layer 42, charges may be accumulated to cause electro-static discharge. The electro-static discharge exerts a fatal influence on the interconnection of a thin film transistor to cause defects such as a short of the interconnection of the thin film transistor. According to an embodiment of the present invention, when the light blocking layer 60 is divided into a plurality of parts, charges are less accumulated as compared with the prior division of the light blocking layer 60, so that electro-static discharge can be reduced.

In addition, the opening A' is formed below the gate line 32 or the data line 34, so that coupling between metal of the light blocking layer 60 and the gate line 32 or the data line 34 can be reduced.

If the opening A' has a width wider than that of the data line 34, light may leak. Accordingly, a width W1 of the opening A' is narrower than a width W2 of the data line 34. In order to prevent light from leaking through the opening A', both edges of the gate line 32 are overlapped with a portion of the light blocking layer 60.

According to the present invention, although the opening A' is formed in the light blocking layer 60 below the data line 34 in the drawings, the opening A' may be formed below the power line 35 to supply power to the second thin film transistor T2 if necessary.

The light blocking layer 60 may be a single layer of chromium oxide (CrOx), a double layer of chromium oxide (CrOx)/chromium nitride (CrNx), or a triple layer of chromium oxide (CrOx)/chromium (Cr)/chromium nitride (CrNx).

If the light blocking layer 60 includes the above material, the light blocking layer 60 can reduce defects as compared with a case in which the light blocking layer 60 includes chromium (Cr) or molybdenum (Mo) in the conventional technology. Since the metal such as chromium (Cr) or molybdenum (Mo) has a melting temperature lower than that of metal oxide, the metal such as chromium (Cr) or molybdenum (Mo) may be melted in the middle of performing various thin film transistor processes (including a process of crystallizing amorphous silicon) requiring heat. In addition, since the metal such as chromium (Cr) or molybdenum (Mo) has high thermal conductivity, heat may be easily conducted during the processes. Even if the metal such as chromium (Cr) or molybdenum (Mo) is not instantly melted, the metal may be melted with time difference by latent heat.

When patterning is performed during a thin film transistor process, heat energy is condensed on a boundary interfacial surface of a pattern, so that a boundary of the light blocking layer 60 may be swollen, called "hunching". When the hunching causes the light blocking layer 60 to be protruded more than another region, failure may result from a step difference in the subsequent process. In addition, the protrusion may be separated from the light blocking layer 60 to serve as impurities so that failure of the substrate 12 may be caused. The impurities are fine particles in most cases, but may float as large-sized particles.

Figure 5:
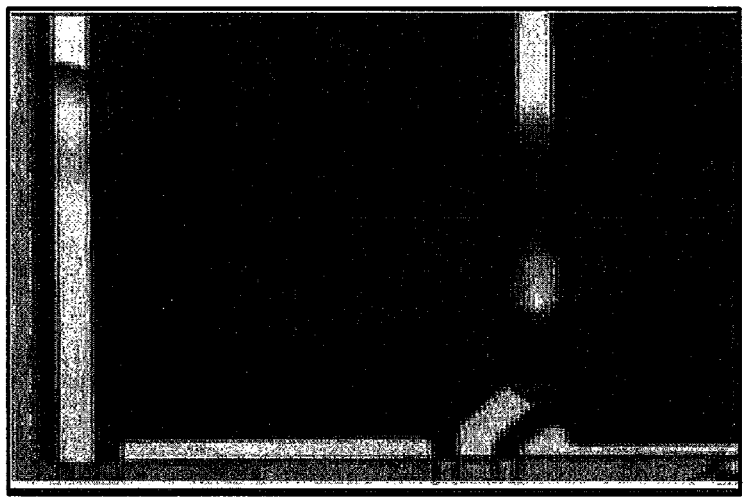
FIGS. 5 and 6 are photographic views showing substrate failure caused by hunching, respectively.
Figure 6:
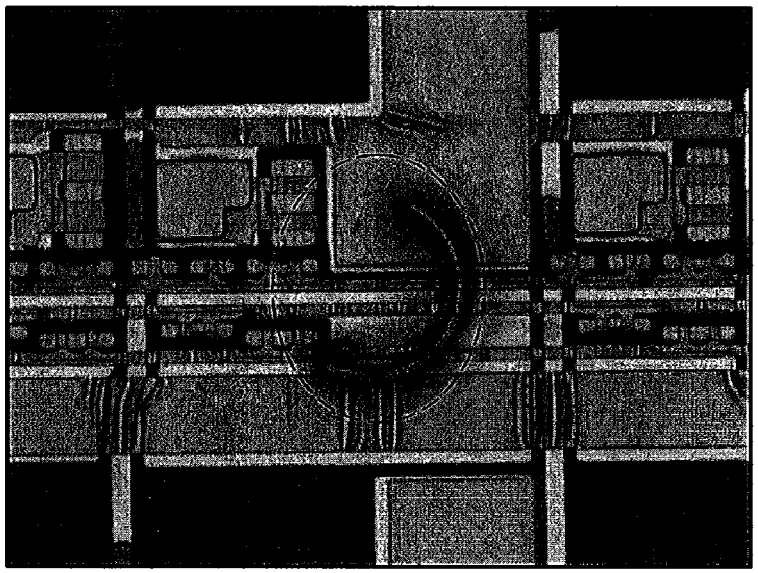

FIGS. 5 and 6 are photographic views showing substrate failure. It can be observed from FIG. 5 that a line is disconnected due to the protrusion swollen on the substrate, and it can be observed from FIG. 6 that metal swollen due to hunching deviates from an original position thereof to float on devices as impurities.

Therefore, according to an embodiment of the present invention, in order to prevent the hunching, metal oxide having a fusion temperature higher than that of the metal such as chromium (Cr) or molybdenum (Mo) is used, or a metal oxide layer of a double layer is formed on the metal to serve as a buffer layer preventing thermal conduction. A material having a high fusion temperature and used for the light blocking layer 60 may be representatively chromium oxide (CrOx). Accordingly, the light blocking layer 60 can be formed as a single layer or a multiple-layer including chromium oxide (CrOx).

According to an embodiment of the present invention, the light blocking layer 60 is formed on the substrate 12 as a single layer of chromium oxide (CrOx). According to another embodiment of the present invention, chromium nitride (CrNx) may be further formed on chromium oxide (CrOx) to form the light blocking layer 60. Since the chromium nitride (CrNx) is rarely melted and has a low reflectivity, the chromium nitride (CrNx) may form the double layer together with the chromium oxide (CrOx).

Further, according to another embodiment of the present invention, a triple layer including chromium oxide (CrOx)/chromium (Cr)/chromium oxide (CrOx) may be formed, or a triple layer including chromium oxide (CrOx)/chromium (Cr)/chromium nitride (CrNx) may be formed. In the case of the triple layer, since a chromium oxide (CrOx) or chromium nitride (CrNx) layer is further formed on a chromium (Cr) layer, an upper layer blocks heat once more to prevent heat from being directly delivered to the chromium (Cr) layer to melt the chromium (Cr) layer. Accordingly, substrate failure caused by the hunching of the chromium (Cr) layer can be significantly reduced.

Hereinafter, a method of manufacturing the organic light emitting display having the above structure will be described with reference to FIGS. 1 and 2.

First, the substrate 12 including a transparent material is prepared. The substrate 12 includes pixels having the display region P in which an image is displayed and the non-display region N in which an image is not displayed.

Next, in the non-display region N of the substrate 12, the light blocking layer 60 having the opening A is formed. The opening A corresponds to the region of the semiconductor layers 40 and 42 of the thin film transistors T1 and T2 to be formed in the next process. The light blocking layer 60 may be formed in the region of the gate line 32 and the data line 34 thereafter if necessary.

The light blocking layer 60 may be formed in a single layer of chromium oxide (CrOx), a double layer of chromium oxide (CrOx)/chromium nitride (CrNx), or a triple layer of chromium oxide (CrOx)/chromium (Cr)/chromium nitride (CrNx). In this case, the light blocking layer 60 may be formed through various schemes including a deposition scheme.

Subsequently, the first insulating layer 13 is formed on the substrate 12 having the light blocking layer 60.

The gate line 32, the data line 34, and the thin film transistors T1 and T2 connected to the gate line 32 and the data line 34 are formed on the substrate 12 having the light blocking layer 60. In this case, one thin film transistor may be provided for each pixel, but, if necessary, the first and the second thin film transistor T1 and T2 may be provided. The second thin film transistor T2 drives the first electrode 16 and the first thin film transistor T1 applies data voltage to the second thin film transistor T2.

Hereinafter, a process of forming the second thin film transistor T2 of the first and second thin film transistors T1 and T2 will be representatively described, and details of the first thin film transistor T1 will be omitted in order to avoid redundancy.

The semiconductor layer 42 is formed on the first insulating layer 13. The semiconductor layer 42 has the same shape as that of the opening A of the light blocking layer 60, and is overlapped with the opening A.

The second insulating layer 14 is formed on the substrate 12 having the semiconductor layer 42. The gate line 32 and the gate electrode 38 branched from the gate line 32 are provided on the substrate 12 having the second insulating layer 14.

The gate insulating layer 57 is formed on the substrate 12 having the gate electrode 38.

Then, contact holes are formed on a portion of the gate insulating layer 57 and the second insulating layer 14 such that a portion of the semiconductor layer 42 is exposed, respectively.

Next, the data line 34 crossing the gate line 32, the source electrode 52 branched from the data line 34, and the drain electrode 56 spaced apart from the source electrode 52 are provided on the substrate 12 having the gate insulating layer 57. The source and drain electrodes 52 and 56 are connected to the semiconductor layer 42 through the contact holes formed in the gate insulating layer 57 and the second insulating layer 14, respectively. The protective layer 57' is formed on the substrate 12 having the source and drain electrodes 52 and 56.

As described above, after forming the second thin film transistor T2, the first electrode 16 connected to the second thin film transistor T2 is formed. First, a contact hole is formed in the protective layer 57' to expose a portion of the drain electrode 56.

Next, the first electrode 16 including a conductive material is formed on the protective layer 57'. In this case, the first electrode 16 is connected to the drain electrode 56 through the contact hole.

Thereafter, the organic light emitting layer 18 is formed on the first electrode 16, and the second electrode 19 is formed on the organic light emitting layer 18, thereby manufacturing the organic light emitting display.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. An organic light emitting display, comprising:
   a substrate which comprises a plurality of pixels, each pixel comprising a display region, in which an image is displayed, and a non-display region surrounding the display region;
   at least one thin film transistor formed in the non-display region of the substrate, the thin film transistor comprising a semiconductor layer;
   a first electrode formed in the display region, the first electrode being connected to the thin film transistor;
   an organic light emitting layer formed on the first electrode;
   a second electrode formed on the organic light emitting layer, the second electrode applying voltage to the organic light emitting layer via the first electrode; and
   a light blocking layer formed in the non-display region of the substrate, the light blocking layer having an opening which overlaps the semiconductor layer of the thin film transistor.

2. The organic light emitting display of claim 1, wherein the semiconductor layer comprises a polycrystalline silicon layer.

3. The organic light emitting display of claim 1, wherein the at least one thin film transistor comprises:
   a first thin film transistor applying voltage to the first electrode; and
   a second thin film transistor applying data voltage to the first thin film transistor.

4. The organic light emitting display of claim 1, wherein the semiconductor layer is formed on the substrate and comprises a source region, a channel region, and a drain region, and
   the thin film transistor comprises:
   a gate insulating layer formed on the semiconductor layer;
   a gate electrode formed on the gate insulating layer;
   an inter-layer dielectric layer having contact holes to expose a portion of the source and drain regions, respectively; and
   source and drain electrodes connected to the source and drain regions through the contact holes, respectively.

5. The organic light emitting display of claim 1, wherein the opening has a size substantially identical to a size of the semiconductor layer.

6. The organic light emitting display of claim 1, wherein the opening has a size smaller than a size of the semiconductor layer.

7. The organic light emitting display of claim 1, further comprising a plurality of gate lines and a plurality of data lines formed on the non-display region of the substrate, the gate and data lines crossing each other to define the pixels.

8. The organic light emitting display of claim 7, wherein the opening of the light blocking layer is formed below the gate line.

9. The organic light emitting display of claim 8, wherein the opening formed below the gate line has a width narrower than a width of the gate line, and the light blocking layer is overlapped with a portion of the gate line.

10. The organic light emitting display of claim 7, wherein the opening of the light blocking layer is formed below the data line.

11. The organic light emitting display of claim 10, wherein the opening formed below the data line has a width narrower than a width of the data line, and the light blocking layer is overlapped with a portion of the data line.

12. The organic light emitting display of claim 1, wherein the light blocking layer comprises a chromium oxide layer.

13. The organic light emitting display of claim 1, wherein the light blocking layer comprises a chromium oxide layer or a chromium nitride layer formed on the chromium nitride layer.

14. The organic light emitting display of claim 1, wherein the light blocking layer comprises a chromium oxide layer, a chromium layer formed on the chromium oxide layer, and a chromium nitride layer or a chromium oxide layer formed on the chromium layer.

15. The organic light emitting display of claim 1, wherein the organic light emitting layer emits light when voltage is applied to the first and second electrodes, and the light is output from the second electrode to the first electrode.

16. The organic light emitting display of claim 15, wherein the first electrode has a work function higher than a work function of the second electrode.

17. The organic light emitting display of claim 1, wherein the second electrode comprises metal.

18. A method of manufacturing an organic light emitting display, the method comprising:
   forming a light blocking layer having an opening on a non-display region of a substrate, the substrate comprising a plurality of pixels, each pixel comprising a display region and the non-display region;
   forming at least one thin film transistor comprising a semiconductor layer overlapped with the opening on the non-display region of the substrate having the light blocking layer;
   forming a first electrode connected to the thin film transistor on the display region;
   forming an organic light emitting layer on the first electrode; and
   forming a second electrode on the organic light emitting layer.

19. The method of claim 18, wherein the semiconductor layer comprises a polycrystalline silicon layer.

20. The method of claim 19, wherein the polycrystalline silicon layer is formed through one of a solid phase crystallization scheme, an excimer laser annealing scheme, a metal induced crystallization scheme, and a sequential lateral solidification scheme.

21. The method of claim 18, wherein the light blocking layer comprises a single layer of chromium oxide, a double layer of chromium oxide/chromium nitride, or a triple layer of chromium oxide/chromium/chromium nitride.

22. The method of claim 18, wherein the opening has a size substantially identical to a size of the semiconductor layer.

23. The method of claim 18, wherein the opening has a size smaller than a size of the semiconductor layer.

24. The method of claim 18, further comprising forming a plurality of gate lines and a plurality of data lines formed on the non-display region of the substrate, the gate and data lines crossing each other to define the pixels.

25. The method of claim 24, further comprising forming the opening below at least one of the gate and data lines.

26. The method of claim 25, wherein the opening formed below the gate and data lines has a width narrower than a width of the gate and data lines, and the light blocking layer is overlapped with a portion of the gate and data lines.

* * * * *